United States Patent [19]

Bulst et al.

[11] Patent Number: 4,679,014

[45] Date of Patent: Jul. 7, 1987

[54] FILTER FUNCTIONING WITH ACOUSTIC WAVES

[75] Inventors: Wolf-Eckhart Bulst, Vaterstetten; Mira Erthel; Peter Zibis, both of Munich, all of Fed. Rep. of Germany

[73] Assignee: Siemens Aktiengesellschaft, Berlin and Munich, Fed. Rep. of Germany

[21] Appl. No.: 819,304

[22] Filed: Jan. 16, 1986

[30] Foreign Application Priority Data

Jan. 22, 1985 [DE] Fed. Rep. of Germany ....... 3501977

[51] Int. Cl.⁴ .................. H03H 9/145; H03H 9/25; H03H 9/64; H01L 41/04
[52] U.S. Cl. ................ 333/195; 310/313 D; 333/153; 29/25.35; 427/100
[58] Field of Search ................ 333/150–155, 333/193–196; 310/313 R, 313 A, 313 B, 313 C, 313 D; 29/25.35, 594; 427/96, 100, 145, 160

[56] References Cited

U.S. PATENT DOCUMENTS 4,325,037 4/1982 Bulst et al. .................. 333/194

FOREIGN PATENT DOCUMENTS 3314725 10/1984 Fed. Rep. of Germany .

Primary Examiner—Marvin L. Nussbaum
Attorney, Agent, or Firm—Hill, Van Santen, Steadman & Simpson

[57] ABSTRACT

A surface wave filter is provided with digital structures formed of strip-shaped coatings which are photolithographically produced. The digital structures have groups allocated to them which are also formed of strip-shaped coatings and which follow a respective digital structure. By use of such groups, which do not produce interfering reflections, a level exposure during formation of the digital structures is achieved.

12 Claims, 1 Drawing Figure

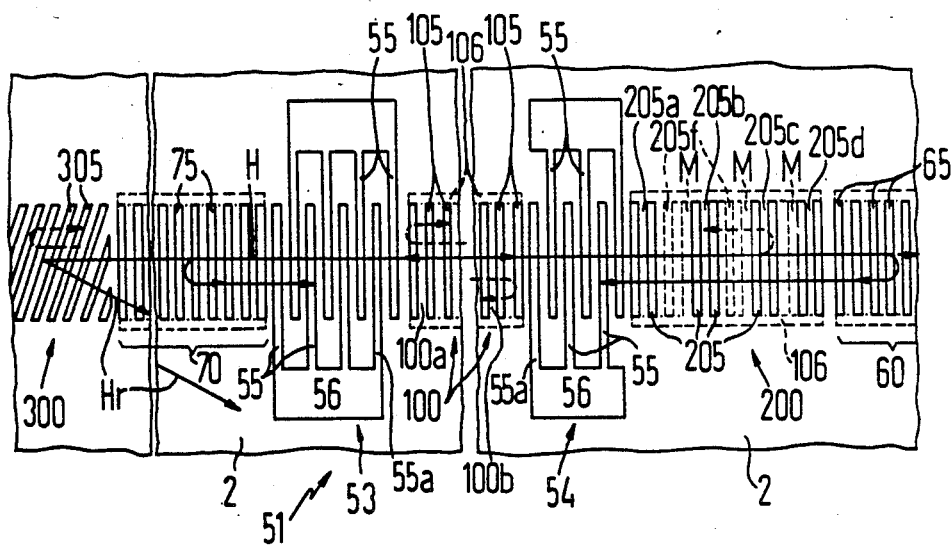

FILTER FUNCTIONING WITH ACOUSTIC WAVES

RELATED APPLICATION

This application is related to a co-pending application of Bulst, Lindeman, and Zibis entitled "FILTER FUNCTIONING WITH ACOUSTIC WAVES", Ser. No. 813,827, filed Dec. 27, 1985.

BACKGROUND OF THE INVENTION

The present invention relates to an improvement in the structure of a filter which functions with acoustic waves running close to the surface in a substrate wherein digital structures are provided as reflectors and/or input/output transducers.

A filter corresponding to the invention can be operated not only with acoustic surface waves (Rayleigh and Bleustein waves) in the narrowest sense but also with Lamb waves, Love waves, surface-skimming bulk waves and the like which proceed in a substrate at least close to the surface. The type of wave generated in the individual case depends on techniques in dimensioning the transducers which are known to a person skilled in the art, and may also depend on anisotropy properties of the substrate.

Surface wave resonator filters in the sense of the invention comprise digital structures situated on a piezo electric substrate, these digital structures including interdigital structures to be employed as transducers and reflector structures. Interdigital structures are formed of strip electrodes adjacent to one another and electrically connected at sides of the structures. The digital structure of a reflector is formed of strip-like fingers, finger pieces, dots or the like which are preferably metallization strips applied to the substrate surface.

An arrangement and dimensioning of the fingers, strips, and the like of the structures are based on the rules for the respective filter. The fundamentals for dimensioning and measurement of the digital structures are known. Let German OS No. 29 09 705, U.S. Pat. No. 4,325,037, and German OS No. 3 314 725 be referenced in this regard.

Bus bars are provided for interdigital structures, the fingers of the respective one finger structure being connected to one another with these bus bars. The fingers of the one finger structure engage in comb-like fashion into a corresponding, second finger structure and form the interdigital structure with the latter. A terminal pad which is usually relatively large in area connects to these bus bars situated to the side of the interdigital structure. The leads required for the interdigital structure employed as a transducer are connected to these pads which are connected to the respective bus bar, or form a part thereof.

The quality and performance of such a surface wave filter depend, among other things, on the exact fashioning, positioning, and precise, sharp-edged limitation of the strip-shaped fingers of the respective digital structure whether this is a matter of an interdigital structure or of a reflector structure.

SUMMARY OF THE INVENTION

An object of the present invention is to specify such a structure or such structures for a surface wave filter which optimally meet these requirements.

This object is achieved with a surface wave filter structure wherein a group composed of further, strip-shaped coatings is attached to the free end of the respective structure. The group of further coatings operates in a reflection-free manner so as not to inhibit operational characteristics of the filter. The group is provided adjacent the end of the respective interdigital structure and runs along a running direction of propagated waves in the filter. The additional coatings are similar to the coatings of the digital structure so that during manufacture, a level exposure of coatings of the interdigital structure is achieved. Specifically, outermost fingers of the interdigital structure adjacent the group of further coatings are exposed to approximately the same extent as centrally located fingers in the interdigital structure.

The digital structures of surface wave filters are photolithographically manufactured in combination with a lift-off technique or etching technique. The present invention is based on the perception that problems arise in the photolithographic transfer of the pattern or of the original onto the photosensitive layer present at this point in time over the substrate surface of the filter. Particularly given projection transfer, these problems arise since every digital structure (as viewed in one direction) to be manufactured necessarily comprises first and last strip-shaped coatings (fingers, digit strips) and that the respective end of the digital structure (at least in the control case) is followed by a surface region of the substrate surface which is free of further strip-like coatings of structures. Mean exposure values which are lower than the exposure values required for the first or last strip-shaped coatings suffice for the central or internal region of a digital structure to be photolithographically manufactured with exposure. Given an adapted setting of the exposure to the central region of a structure, this leads to under-exposure of these first and last strip-shaped coatings or, inversely, the central region experiences over-exposure when the starting and end region of the corresponding structure is exposed in a precise way.

To eliminate the above problem with differentially selected exposure would be very involved, and some other way of alleviating this problem has been sought. It has been discovered that by attaching groups formed of further strip-shaped coatings the problems can be solved. These further strip-like coatings are identical to or at least comparable to the strip-shaped coatings of the corresponding digital structure or manufacture thereof which is to be improved.

Viewed only from the point of view of the levelling of the exposure value for the respective, overall digital structure achieved with the invention, it would suffice to provide only a few, for example five to twenty, further strip-shaped coatings which are no longer to be assigned to the corresponding end of the digital structure, but rather to the auxiliary group. Particularly given a non-interdigital digital structure designed as a resonator structure, this technique would not yet be adequate by itself, for the strip-shaped coatings of the auxiliary group would not functionally differ from those of the actual resonator digital structure.

It is provided as a further technique in the invention that these further strip-shaped coatings of the respective group be positioned such that this group is effective in a reflectionfree manner for the filter with reference to the wave of the digital structure to which this group is attached, or with reference to the wave appearing in the filter which is defined by the most narrow-banded structure of the filter and which also runs through or in the digital structure to which this corresponding group is attached.

This is not contrary to the fact that such a group can fill out the entire clearance between two digital structures following on another in a longitudinal direction or in a wave propagation running direction of the wave filter. The group extends gap-free from the one digital structure up to the one neighboring digital structure, so that this group is actually allocated to two digital structures.

Three alternatives are available within the framework of the present invention for this technique of making the corresponding group or the strip-shaped coatings of such a group effective in a reflection-free manner. One of these alternatives can have an advantage over the other two on a case-by-case basis. Also, only one of the alternatives may be usable on a case-by-case basis. The first of these alternatives is to apply the techniques of frequency shift disclosed in German Patent No. 29 09 705 corresponding to U.S. Pat. No. 4,325,037, and in the German patent application No. P 34 38 246.1, all incorporated herein by reference, to the structure of the group with reference to the corresponding digital structure, or to the digital structure defining the center frequency $f_0$ of the filter. This means that the group is dimensioned in view of the spacings of its strip-shaped coatings measured in wavelength units such that the frequency $f_R$ of the first null or zero position of the interdigital reflection at the coatings of the group at least essentially coincides with the center frequency $f_0$ of the wave of the filter. Interdigital reflections of the group are then no longer effective for the filter. In accordance with the rules of this technique from the aforementioned U.S. Patent, the bandwidth of the group is to be left with a size that amounts to at least twice the bandwidth of the filter. This, however, can be observed without any difficulty whatsoever since the length of the structure of the group is limited, whereby an adequate number (at least 20 to 50) of the strip-shaped coatings of the group are always provided for solving the problem of levelled exposure.

The second alternative is the division of the strip-shaped coatings of the group into sub-groups which are respectively composed of a few strips (for example 2 to 10 strips), and to arrange these individual sub-groups spaced from one another by additional quarter-wavelength spacer values, so that these individual sub-groups of the group destructively interfere with one another, i.e. effect mutual cancelling of the components respectively reflected at the individual sub-groups.

The third alternative is to provide a slanted position of the strip-shaped coatings of a group such that reflections occurring at the strip-shaped coatings of the group are conducted out of the filter such that they can no longer enter into the one or several transducers of the filter. This latter alternative, however, can only be employed given a group which is situated at the outermost end of the filter, i.e. is situated where a desired wave of the filter no longer appears, since this would then be likewise deflected toward the outside to a corresponding degree in a disadvantageous manner.

Let it be pointed out that interdigital reflections also occur at the strip-shaped coatings of the groups. In the invention, however, these are rendered ineffective or at least negligible for the filter.

BRIEF DESCRIPTION OF THE DRAWING

The drawing FIGURE shows an embodiment of the invention encompassing three alternative developments which are to be optionally employed individually or in combination, the alternatives specifically relating to the techniques of rendering the respective group effective in a reflection-free manner or of rendering the respective group non-reflecting for the filter.

DESCRIPTION OF THE PREFERRED EMBODIMENTS

The structures of the filter 51 shown in the drawing FIGURE are situated on the surface of a piezo electric substrate 2 of which only portions are shown. A first interdigital structure is referenced 53 and a second interdigital structure is referenced 54, these two interdigital structures being employed as transducers, for example as an input transducer and as an output transducer. The strip-shaped coatings (fingers, digit strips) of these interdigital structures are referenced 55. Reference numeral 56 indicates pads which respectively simultaneously serve as a bus bar for the strip-shaped coatings 55 which engage interdigitally into one another.

As may be seen from the drawing FIGURE, the two interdigital structures 53 and 54 have a spacing from one another which can be provided or is necessary for electrical and/or acoustical reasons of the filter 51. In the prior art, this is a free or unoccupied substrate surface. In the invention and in accordance with the illustration of the drawing FIGURE, this clearance between the two interdigital structures 53 and 54 contains further strip-shaped coatings 105. Only three strip-shaped coatings 105 of the group 100 provided in accordance with the invention are shown in the drawing FIGURE.

In general, a group provided in accordance with the invention has at least 20 to 50 strip-shaped coatings 105. It is adequate per se when such a plurality of strip-shaped coatings 105 follows the respective outermost strip-shaped coating 55a of the interdigital structure 53 or of the interdigital structure 54. Strip-shaped coatings 105 of the group 100 placed in the central region of the group can also be omitted, and the required degree of levelling of the exposure is nonetheless achieved for the respective outermost strip-shaped coatings 55, as is the ineffectiveness of the interdigital reflections at the coatings 105 of the group 100 for the filter.

In case the strip-shaped coatings 105 in the central region of the group 100 are omitted, it can also be considered as though two sub-groups 100a and 100b were provided instead, whereby the sub-group 100a is allocated to the digital structure 53 and the sub-group 100b is allocated to the digital structure 54.

Let it be pointed out that such a group 100 can also be provided with bus bars 106 which are only shown with broken lines because they are optional.

A reflector structure of the filter 51 is referenced 60, this reflector structure only having its initial part shown. This reflector structure 60 is formed of strip-shaped coatings 65 which are situated at wavelength spaces from one another in accordance with standard rules for surface wave filters and the prescriptions for this filter. Bus bars are referenced 66, these being shown with broken lines because they are only optionally provided.

The clearance between the interdigital structure 54 and this reflector structure 60 is filled with a group 200 in accordance with the invention, this group 200 being formed of strip-shaped coatings 205. As is shown, these strip-shaped coatings 205 are divided into four sub-groups 205a through 205d. The strip-shaped coatings 205 of this group 200 serve the purpose of levelling the exposure in the photolithographic manufacture of the interdigital structure 54 and of the reflector structure 60.

A further reflector structure of the filter 51 is referenced 70, this following the interdigital structure 53 in a gap-free manner in this example. A group according to the invention between the interdigital structure 53 and the reflector structures 70 is consequently not required. The illustrated embodiment, however, has a group 300 provided in accordance with the invention which follows at the left-side end of the reflector structure 70. The strip-shaped coatings 305 likewise serve the purpose that the last strip-shaped coatings 75 of the reflector structure 70 at the left-hand side are just as optimally exposed as the strip-shaped coatings of the central region of the reflector structure 70 in the exposure during the photolithographic manufacture of the reflector structure 70.

As has already been expressly pointed out above, with the invention, the groups 100, 100a, 100b, 200, and 300 are effective in a reflection-free manner for the filter 51.

In accordance with a first alternative of the invention, the strip-shaped coatings 105 of the group 100 (the same applies to sub-groups 100a and 100b provided instead) are situated at center-to-center spacings from one another which are dimensioned in accordance with the teaching of the afore-mentioned U.S. Patent. Quantitatively, the center-to-center spacings of the strip-shaped coatings 105 of the group 100 are dimensioned somewhat greater or somewhat smaller than the center-to-center spacings of the strip-shaped coatings of that structure which defines the center frequency of the filter 51. This is the structure having the lowest bandwidth of the filter 51. A greater or smaller spacing of the strip-shaped coatings 105 of the group 100 depends on which of the two nulls or zero locations of the interdigital reflections of the group have formed the basis for the dimensioning. Further details regarding the dimensioning to be selected for this alternative of the group 100 are familiar to a person skilled in the art from the aforementioned U.S. Patent.

The group 200 is rendered effective for the filter 51 in reflection-free manner with the assistance of another alternative to be employed for the invention. Within the individual groups 205a, 205b, 205c and 205d, the strip-shaped coatings 205 (respectively two strip-shaped coatings 205 given the illustrated embodiment of the invention) have a center-to-center spacing (of the size of half a wavelength of the wave of the filter 51) corresponding to the structures 53, 54, 60 and/or 70 of the filter 51. This also includes omitted strip-shaped coatings which are referenced 205f in the drawing FIGURE. This periodicity of the spacings is not observed, however, in the group 200 between a group 205a and a group 205d, etc. In accordance with a feature of this alternative, the respective spacing between neighboring groups is enlarged by the dimension M of an additional quarter wavelength. When the width of the strip-shaped coatings is dimensioned equal to a quarter wavelength (as frequently occurs), the spacing between two groups 200a, 200b . . . is increased precisely by one strip width (as in the drawing FIGURE). Instead of the single multiple of a quarter wavelength, this can also be the threefold multiple or the five-fold multiple, etc., of a quarter wavelength. What is achieved with this technique is that the interdigital reflections at the strip-shaped coatings 205 of the sub-group 205a interfere with the interdigital reflections at the strip-shaped coatings 205 of the sub-group 205b and mutually cancel. A corresponding plurality of sub-groups 205a . . . offset relative to one another in accordance with this technique of the invention . . . make it possible that the entire group 200 has no interdigital reflections for the wave of the filter 51.

It is insured for the group 300 that no interdigital reflections proceed from the strip-shaped coatings 305 of this group into the filter 51. In the case of this end-position group 300, this can be achieved in a particularly simple fashion by placing the strip-shaped coating 305 at an angle. The horizontal line illustrated with double arrows in the drawing FIGURE points out the main wave propagation direction H of the filter 51. The direction of the reflection at the obliquely placed strip-shaped coatings 305 is illustrated with Hr. The interdigital reflections having the angle of the direction Hr reflect such a wave component out of the filter 51. As a result of this slanting position, this group 300 has also been rendered effective for the filter 51 in a reflection-free manner.

Given the exemplary embodiment illustrated and described, no group is provided for the right-hand end of the reflector structure 60 (no longer shown in the drawing FIGURE). When omitting such a group there comes into consideration—without repudiating the idea of the invention—that this reflector structure 60 is formed of such a relatively great number of strip-shaped coatings 65 that a significant signal component would hardly be reflected back anyway from this right-hand end of the reflector structure 60, i.e. from the outermost end of the reflector structure 60 in view of the filter 51. Imprecisions in the precision and sharpness of strip-shaped coatings 65 which are positioned at the outermost, right-hand end of the reflector structures 60 have practically no disturbing influence on a filter 51 as illustrated. Quite in contrast thereto, however, great disturbances would proceed from such strip-shaped coatings 65 of the reflector structure 60 which are positioned as shown in the drawing FIGURE, at the left-hand end or in the left half of the reflector structure 60. These strip-shaped coatings 65 of the reflector structures 60 supply the essential component of the wave signal to be reflected in the reflector structure 60 as intended.

The intended running direction of the wave in the filter 51 is referenced H in the drawing FIGURE. The reversing directions Hs shown in arc-like fashion with solid lines are rated or desired reflections of the filter 51, and specifically of its reflector structures 60 and 70. The arc-shaped reverses shown with broken lines, by contrast, refer to interdigital reflections occurring in the groups 100 and 200 which are rendered ineffective for the filter 51 on the basis of one of the techniques of the invention (according to the principle of the first and of the second alternatives described above), i.e. do not occur as signal components in the filter 51.

It is important for the invention that no or at most a very few strip-shaped coatings are omitted between the respective first or last strip-shaped coating of one of the digital structures 53, 54, 60, 70 of the filter 51 and the added, allocated group 100, 100a, 100b, 200, 300 (or between abutting digital structures 53 and 70). This does not contradict the fact that no group is provided at the outermost end of the reflector structure 60 (because this end of the structure 70 has little effect anyway).

Dimensions that are typical for a filter of the invention are specified below. A transducer structure 53, 54 has, for example, 10 to 400, and preferably 50 to 150 strip-shaped coatings 55 in an interdigital arrangement.

A reflector structure 60, 70 has, for example, 200 to 1000, and preferably 400 to 700 strip-shaped coatings 65, 75.

The respective number of strip-shaped coatings of a transducer or reflector structure is based on the respective prescribed band width for this structure.

Width and center-to-center spacing of the strip-shaped coatings from one another is established by the prescribed frequency or wavelength of the acoustic wave and by the propagation rate of the wave in the substrate body. Standard values are 1.5 to 5 μm for the strip width and 1 to 10 μm for the center-to-center spacing.

The length of the individual strip-shaped coatings is usually dimensioned between 20 and 200 wavelengths.

The above description of the invention takes manufacture of the digital structures based on the principle of lift-off technique into consideration. A positive photosensitive resist is employed in this technique. A surface-wide coating with such a photoresist is first undertaken on the substrate surface. Exposure corresponding to the desired structures then follows. Specifically, those surface portions of the layer situated on the substrate surface which are subsequently strip-shaped coatings, pads, and bus bars are exposed. After developing, the exposed portion of the photoresist is stripped and the entire surface (exposed surface portions of the substrate surface and photoresist which still remains) is coated with a metal layer (vapor-deposited). Finally, the surface portions of the photoresist which have still remained are stripped, those portions of the metal layer which are situated on photoresist are thereby lifted off, and the desired structures remain on the substrate surface as metallic coatings.

A manufacture of the structures according to the principle of the etching technique is, so to speak, the opposite process (occurring with the same final result). The substrate surface is thus first covered with a metal layer. This metal layer is coated with the photoresist layer and the exposure is then carried out, but those surface portions which are free of metallizations of the substrate surface in the finished filter are exposed here. Stripping is carried out after the development of the exposed photoresist, whereby the metallization layer present on the substrate surface therebelow is exposed in those surface portions which must be free of metallization of the substrate surface in the finished filter. These exposed portions of the metallization layer are removed from the substrate surface by means of subsequent etching, and those portions of the original metallization of the substrate surface which are protected during the etching by surface portions of the photoresist layer still remain as the desired structures of the filter.

The lift-off technique and the etching technique differ since the respective complementary surface portions are to be exposed.

Although various minor changes and modifications might be proposed by those skilled in the art, it will be understood that we wish to include within the claims of the patent warranted hereon all such changes and modifications as reasonably come within our contribution to the art.

We claim as our invention:

1. An electric acoustic wave filter, comprising:
   a digital structure comprising a plurality of strip-shaped coatings on a surface of a substrate;
   said digital structure being situated along a running direction of propagated waves in the filter;
   the digital structure being one of the elements selected from the group consisting of a transducer or resonator structure;
   a group of additional strip-shaped coatings similar to the strip-shaped coatings of the digital structure, said group being arranged directly adjacent an end of the digital structure and also along said running direction of said propagated waves in the filter;
   said group of additional coatings being dimensioned and arranged such that it functions in a reflection-free manner so as not to affect normal operation of the filter; and
   said group of additional coatings being dimensioned and positioned with respect to the end of the digital structure such that during manufacture of the digital structure through an exposure technique, coatings of the digital structure at the end adjacent the group of additional coatings are exposed to substantially a same degree as more centrally located fingers of the digital structure so that exposure is levelled during production of the interdigital structure.

2. A filter according to claim 1 wherein two of said digital structures are provided following one another in the running direction of the propagated waves of the filter, and wherein said group is provided in a space between the two digital structures.

3. A filter according to claim 2 wherein within said group of additional coatings, some individual coatings are omitted in a central portion of the group.

4. A filter according to claim 1 wherein said group of additional coatings has between 20 and 50 strip-shaped additional coatings.

5. A filter according to claim 1 wherein said design of said group such that it operates in a reflection-free manner comprises the additional strip-shaped coatings arranged at center-to-center spacings from one another which deviate by a given amount from center-to-center spacings of strip-shaped coatings of the corresponding digital structure of the filter and which define the center frequency $f_0$ of said filter; and said amount of deviation being selected such that a frequency $f_R$ of a first null of interdigital reflections of said group of additional strip-shaped coatings coincides with said center frequency $f_0$ of said filter.

6. A filter according to claim 1 wherein said design of said group of additional coatings so as to operate in a reflection-free manner comprises a division of the coatings of the group into a plurality of sub-groups, adjacent sub-groups being arranged with respect to their center-to-center spacings between a respective last coating of the one sub-group and the first coating of the following sub-group such that these spacings differ by a quarter wavelength and an uneven multiple of a quarter wavelength from period spacings of the digital structure defining a center frequency $f_0$ of said filter.

7. A filter according to claim 1 wherein said design of said group of additional coatings such that it operates in a reflection-free manner comprises said group being arranged such that its additional strip-shaped coatings are arranged obliquely so as to form an angle with said running direction of the propagated waves such that interdigital reflections in said group by said additional strip-shaped coatings are reflected out of said filter in an oblique direction so as not to affect normal operation of the filter.

8. A filter according to claim 1 wherein at least two of said interdigital structures are provided, one of which is a transducer and the other of which is a reflector structure, and wherein two of said groups of additional coatings are provided, one group at one end of the reflector structure and the other group at one end of the transducer structure.

9. A filter according to claim 1 wherein the additional coatings of the group each have a length substantially the same as a length of active portions of fingers in the interdigital structure.

10. A filter according to claim 9 wherein the additional coatings in the group have a width substantially the same as a width of the coatings in the interdigital structure.

11. An electric acoustic wave filter, comprising:
a plurality of digital structures each comprising a plurality of strip-shaped coatings on a surface of a substrate;
said digital structures each being situated along a running direction of propagated waves in the filter;
a group of additional strip-shaped coatings similar to the strip-shpaed coatings of at least one of the digital structures, said group being arranged directly adjacent an end of the at least one digital structure and also along said running direction of said propagated waves in the filter;
said group of additional coatings being dimensioned and arranged such that it functions in a manner so as not to affect normal operation of the filter; and
said group of additional coatings being dimensioned and positioned with respect to the end of the at least one digital structure such that during manufacture of the digital structure through an exposure technique, an exposure levelling occurs wherein fingers at and near side one end of the digital structure are exposed substantially to a same extent as fingers inwardly of said fingers at and near said one end.

12. A method for the manufacture of a digital structure of an electric filter, comprising:
providing a substrate;
providing a coating on the substrate;
forming the digital structure by an exposure technique so as to form strip-shaped coating as fingers, and providing at least one group of additional strip-shaped coatings as fingers adjacent one end of the digital structure; and
dimensioning and positioning the additional strip-shaped coatings of the group relative to the digital structure and its strip-shaped coatings such that during said exposure technique by which both the digital structure and said one group are formed, an exposure levelling occurs so that digital structure coating fingers at and near said one end of the digital structure adjacent said at least one group are exposed substantially to a same extent as digital coating fingers inwardly of the coating fingers near and at said outer end of the digital structure.

* * * * *